United States Patent
Chen

(10) Patent No.: US 12,120,910 B2
(45) Date of Patent: Oct. 15, 2024

(54) DISPLAY MODULE AND MOBILE TERMINAL

(71) Applicant: WUHAN CHINA STAR OPTOELECTRONICS SEMICONDUCTOR DISPLAY TECHNOLOGY CO., LTD., Hubei (CN)

(72) Inventor: Hui Chen, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 471 days.

(21) Appl. No.: 17/623,934

(22) PCT Filed: Dec. 23, 2021

(86) PCT No.: PCT/CN2021/140970
§ 371 (c)(1),
(2) Date: Dec. 30, 2021

(87) PCT Pub. No.: WO2023/115484
PCT Pub. Date: Jun. 29, 2023

(65) Prior Publication Data
US 2023/0200123 A1    Jun. 22, 2023

(30) Foreign Application Priority Data

Dec. 22, 2021 (CN) .......................... 202111575947.1

(51) Int. Cl.
*H10K 50/86*    (2023.01)
*H04M 1/02*    (2006.01)
*H10K 59/38*    (2023.01)

(52) U.S. Cl.
CPC ........ *H10K 50/865* (2023.02); *H04M 1/0266* (2013.01); *H10K 59/38* (2023.02)

(58) Field of Classification Search
CPC ............................ H10K 59/38; H10K 50/865
(Continued)

(56) References Cited

U.S. PATENT DOCUMENTS

2021/0284908 A1 *    9/2021    Kim ...................... H10K 59/38

FOREIGN PATENT DOCUMENTS

| CN | 103091894 A | 5/2013 |
|----|-------------|--------|
| CN | 109713026 A | 5/2019 |

(Continued)

OTHER PUBLICATIONS

Journal of Beijing University of Chemical Technology (Natural Science Edition), Issue 05 Sep. 20, 2011 Wang, TaoYe, ETC. Fabrication and characterization of highly transparent polycarbonate/ZnO nanocomposite films with novel UV-shielding optical-properties.

*Primary Examiner* — Christopher M Raabe
(74) *Attorney, Agent, or Firm* — Rivka Friedman

(57) ABSTRACT

A display module and a mobile terminal are disclosed. The display module includes a display panel, a color film layer, and an ultraviolet (UV) blocking film layer disposed on a side of the color film layer away from the display panel. The UV blocking film layer covers the color film layer. A material of the UV blocking film layer includes an optical resin material with a UV blocking function. A transmittance of the UV blocking film layer to UV rays below 400 nm is less than 1%, and a transmittance of the UV blocking film layer to visible light is greater than 92%.

20 Claims, 2 Drawing Sheets

(58) Field of Classification Search
USPC .......................................................... 313/112
See application file for complete search history.

(56) References Cited

FOREIGN PATENT DOCUMENTS

| | | | | | |
|---|---|---|---|---|---|
| CN | 111430564 | A | | 7/2020 | |
| CN | 111864092 | A | | 10/2020 | |
| CN | 112420955 | A | | 2/2021 | |
| CN | 113345943 | A | | 9/2021 | |
| CN | 113451364 | A | | 9/2021 | |
| CN | 113690385 | A | | 11/2021 | |
| CN | 113764601 | A | | 12/2021 | |
| CN | 115398285 | A | * | 11/2022 | ........... C07D 487/04 |
| CN | 116997828 | A | * | 11/2023 | ............ G02B 1/111 |
| JP | 2010237566 | A | | 10/2010 | |
| JP | 2018205627 | A | | 12/2018 | |
| WO | WO2024085171 | A | * | 4/2024 | |

* cited by examiner

DISPLAY MODULE AND MOBILE TERMINAL

FIELD OF INVENTION

The present disclosure relates to the field of display, and in particular, to a display module and a mobile terminal.

BACKGROUND OF INVENTION

With the development of the display module R&D technology, display modules are gradually required to be equipped with a full screen and have low power consumption. In the conventional display modules, a polarizer is hard and not resistant to bending. In addition, due to a complex structure of the polarizer, a transmittance of a film layer above a light-emitting layer of the display module is also affected, which imposes a heavy burden on a light-emitting device.

To solve the above problem, a technology of sheet-free polarizers is developed in current products. The current technology used to replace the polarizer is to vapor-deposit RGB photoresist and black frame photoresist above the light-emitting layer to block metal reflection. This technology removes a sheet polarizer, so that the transmittance above the light-emitting layer can be increased from 42-45% to more than 60%, which significantly reduces power consumption. However, due to the elimination of a polarizer layer, ultraviolet (UV) rays are directly incident when external sunlight is irradiated on a display panel, causing damage to a light-emitting material, an electron hole transport layer, an injection layer, etc. in the display panel, and having a relatively large impact on the light-emitting chromaticity and service life of a light-emitting layer of electro-excited light.

SUMMARY OF INVENTION

Technical Problem

Embodiments of the present disclosure provide a dimming layer for a display module and a display module, to solve the technical problem that when a polarizer is not used in the display module, external sunlight is irradiated on a display panel, and ultraviolet (UV) rays are directly incident, causing damage to a light-emitting material, an electron hole transport layer, an injection layer, etc. in the display panel.

Technical Solution

To resolve the foregoing problem, technical solutions provided in the present disclosure are as follows.

An embodiment of the present disclosure provides a display module, including:
a display panel; and
a color film layer disposed on a side of a light-exit surface of the display panel,
wherein an ultraviolet (UV) blocking film layer is disposed on a side of the color film layer away from the display panel, the UV blocking film layer covers the color film layer, a material of the UV blocking film layer includes an optical resin material with a UV blocking function, a transmittance of the UV blocking film layer to UV rays below 400 nm is less than 1%, and a transmittance of the UV blocking film layer to visible light is greater than 92%.

In an embodiment, a material of the UV blocking film layer includes triacetyl cellulose (TAC), cyclo olefin polymer (COP), polycarbonate (PC), or polymethyl methacrylate (PMMA).

In an embodiment, the UV blocking film layer includes at least one UV blocking unit layer, the UV blocking unit layer includes a UV blocking substrate layer and a UV blocking adhesive layer that are disposed in a stacked manner, and the UV blocking adhesive layer is disposed on a side of the UV blocking substrate layer close to the color film layer.

In an embodiment, a thickness of the UV blocking film layer ranges from 50 to 250 um, and an elastic modulus of the UV blocking film layer ranges from 1 to 9 GPa.

In an embodiment, the UV blocking film layer structure includes one UV blocking unit layer, the UV blocking substrate layer has a thickness of 20 to 100 um, and the UV blocking adhesive layer has a thickness of 15 to 50 um.

In an embodiment, the UV blocking film layer includes at least two UV blocking unit layers, and the UV blocking unit layers are disposed in a stacked manner.

In an embodiment, the UV blocking film layer includes two UV blocking unit layers, the UV blocking substrate layer in the UV blocking unit layer has a thickness of 20 to 40 um, and the UV blocking adhesive layer has a thickness of 15 to 50 um.

In an embodiment, an adhesive layer is disposed on a surface of the UV blocking film layer away from the color film layer.

In an embodiment, a material of the UV blocking adhesive layer includes pressure sensitive adhesive (PSA), and a material of the adhesive layer includes photosensitive adhesive.

In an embodiment, in the UV blocking film layer, the UV blocking substrate layer and/or the UV blocking adhesive layer are provided with UV blocking particles.

The present disclosure further provides a mobile terminal, including a display module and a terminal body, wherein the terminal body and the display module are combined into one body, and the display module includes:
a display panel; and
a color film layer disposed on a side of a light-exit surface of the display panel,
wherein a UV blocking film layer is disposed on a side of the color film layer away from the display panel, the UV blocking film layer covers the color film layer, a material of the UV blocking film layer includes an optical resin material with a UV blocking function, a transmittance of the UV blocking film layer to UV rays below 400 nm is less than 1%, and a transmittance of the UV blocking film layer to visible light is greater than 92%.

In an embodiment, a material of the UV blocking film layer include TAC, COP, PC, or PMMA.

In an embodiment, the UV blocking film layer includes at least one UV blocking unit layer, the UV blocking unit layer includes a UV blocking substrate layer and a UV blocking adhesive layer that are disposed in a stacked manner, and the UV blocking adhesive layer is disposed on a side of the UV blocking substrate layer close to the color film layer.

In an embodiment, a thickness of the UV blocking film layer ranges from 50 to 250 um, and an elastic modulus of the UV blocking film layer ranges from 1 to 9 GPa.

In an embodiment, the UV blocking film layer structure includes one UV blocking unit layer, the UV blocking substrate layer has a thickness ranging from 20 to 100 um, and the UV blocking adhesive layer has a thickness ranging from 15 to 50 um.

In an embodiment, the UV blocking film layer includes at least two UV blocking unit layers, and the UV blocking unit layers are disposed in a stacked manner.

In an embodiment, the UV blocking film layer includes two UV blocking unit layers, the UV blocking substrate layer in the UV blocking unit layer has a thickness ranging from 20 to 40 um, and the UV blocking adhesive layer has a thickness ranging form 15 to 50 um.

In an embodiment, an adhesive layer is disposed on a surface of the UV blocking film layer away from the color film layer.

In an embodiment, a material of the UV blocking adhesive layer includes PSA, and a material of the adhesive layer includes photosensitive adhesive.

In an embodiment, in the UV blocking film layer, the UV blocking substrate layer and/or the UV blocking adhesive layer are provided with UV blocking particles.

Beneficial Effects

In the present disclosure, the UV blocking film layer is disposed on the color film layer, and the UV blocking film layer is made of the optical resin material, so that the transmittance of the UV rays below 400 nm through the UV blocking film layer is less than 1%, and the transmittance of visible light is greater than 92%. Furthermore, the display module can reduce the damage to the light-emitting layer in the display panel due to incident UV rays when the external sunlight is irradiated on the display panel without using a polarizer, thereby improving the light-emitting chromaticity of the light-emitting layer of electro-excited light, and effectively prolonging the service life of the light-emitting layer.

DETAILED DESCRIPTION OF PREFERRED EMBODIMENTS

With the development of the display module R&D technology, display modules are gradually required to be equipped with a full screen and have low power consumption. In the display modules, a polarizer is hard and not resistant to bending. In addition, due to a complex structure of the polarizer, a transmittance of a film layer above a light-emitting layer of the display module is also affected, which imposes a heavy burden on a light-emitting device. To solve the above problem, a technology of sheet-free polarizers is developed in current products. The current technology used to replace the polarizer is to vapor-deposit RGB photoresist and black frame photoresist above the light-emitting layer to block metal reflection. This technology removes a sheet polarizer, so that the transmittance above the light-emitting layer can be increased from 42-45% to more than 60%, which significantly reduces power consumption. However, due to the elimination of a polarizer layer, ultraviolet (UV) rays are directly incident when external sunlight is irradiated on a display panel, causing damage to a light-emitting material, an electron hole transport layer, an injection layer, etc. in the display panel, and having a relatively large impact on the light-emitting chromaticity and service life of a light-emitting layer of electro-excited light.

To solve the above technical problems and meet bending requirements of a flexible display module, the present disclosure provides the following technical solutions.

Figure 1:
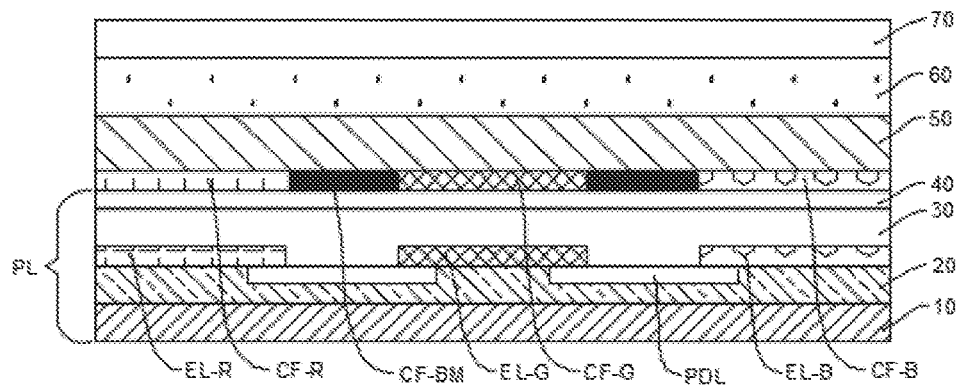
FIG. 1 is a schematic diagram of a structure of a display module according to an embodiment of the present disclosure.
Figure 2:
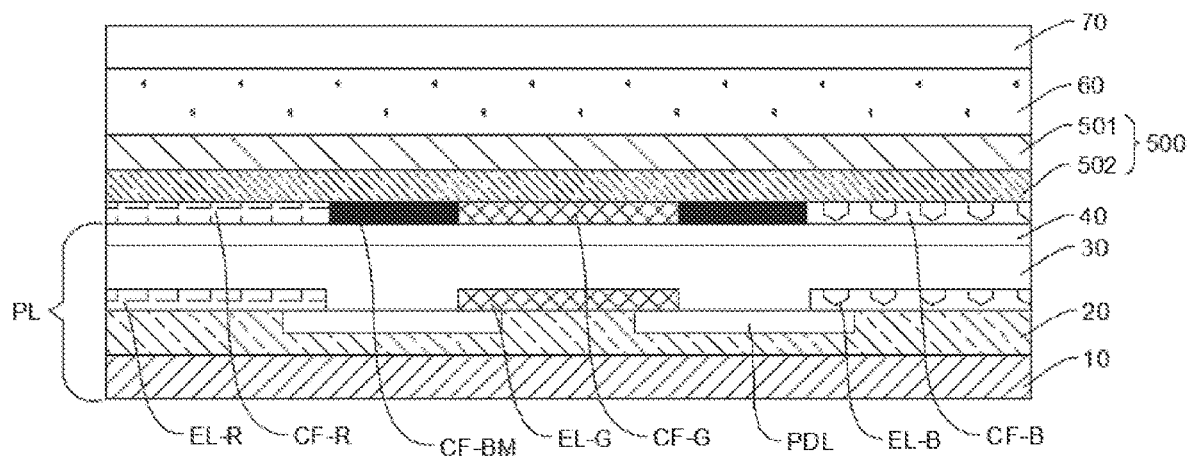
FIG. 2 is a schematic diagram of a structure of another display module according to an embodiment of the present disclosure.
Figure 3:
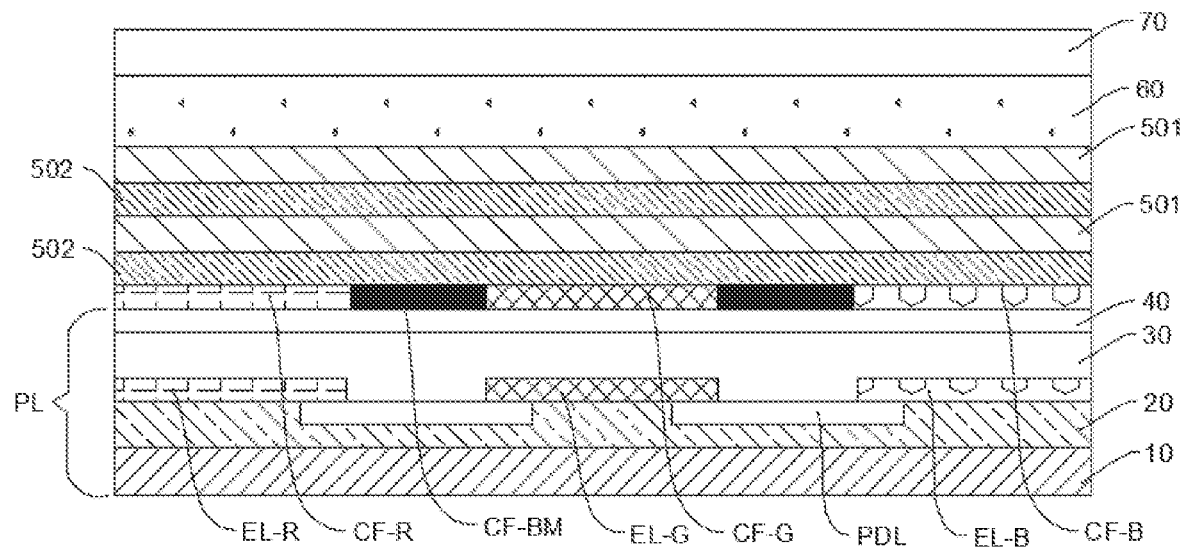
FIG. 3 is a schematic diagram of a structure of a display module with two ultraviolet (UV) blocking unit layers according to an embodiment of this application.

An embodiment of the present disclosure provides a display module, referring to FIG. 1 to FIG. 3, the display module including:

a display panel PL; and a color film layer disposed on a side of a light-exit surface of the display panel PL, wherein an ultraviolet (UV) blocking film layer 50 is disposed on a side of the color film layer away from the display panel PL, the UV blocking film layer 50 covers the color film layer, a material of the UV blocking film layer 50 includes an optical resin material with a UV blocking function, a transmittance of the UV blocking film layer 50 to UV rays below 400 nm being less than 1%, and a transmittance of the UV blocking film layer 50 to visible light being greater than 92%.

Specifically, as shown in FIG. 1, the display panel PL includes a light-emitting diode (LED) display panel PL or an organic light-emitting diode (OLED) display panel PL, and the display panel PL includes a substrate 10, an array substrate layer 20, a pixel definition layer PDL, a light-emitting layer, (including a red light-emitting layer EL-R, a green light-emitting layer EL-G, and a blue light-emitting layer EL-B that are spaced apart in a same layer), an encapsulation layer 30, and a touch substrate layer 40 that are disposed in a stacked manner.

Specifically, the color film layer is disposed on the touch substrate layer of the display panel PL. The color film layer includes a plurality of red color resists CF-R, a plurality of green color resists CF-G, and a plurality of blue color resists CF-B that are spaced apart, and black color resists CF-BM disposed between the color resists. The red color resists CF-R are disposed corresponding to the red light-emitting layer EL-R. The green color resists CF-G are disposed corresponding to the green light-emitting layer EL-G. The blue color resists CF-B are disposed corresponding to the blue light-emitting layer EL-B.

Specifically, the color film layer is disposed in such an array arrangement, so that the color film layer can replace a polarizer, and external light cannot directly pass through the black color resists CF-BM in the color film layer, or cannot be reflected back to the color film layer after passing through the red color resists CF-R/the green color resists CF-G/the blue color resists CF-B. Such a technology of replacing a polarizer with the color film layer can increase a transmittance of visible light by 20% to 30% based on an original transmittance of the visible light of less than 45%. In addition, due to the use of the color film layer, the overall color gamut of the display panel PL is increased by about 5%. Moreover, compared with the polarizer, the color film layer has lower hardness and can be better applied to a flexible display module.

Specifically, the UV blocking film layer 50 is disposed on the side of the color film layer away from the display panel, and the UV blocking film layer 50 covers the color film layer. The UV blocking film layer 50 has a transmittance of 92% or more for the visible light, and has a transmittance of less than 1% for the UV rays of 400 nm or less.

Specifically, as shown in FIG. 1 to FIG. 3, the UV blocking film layer 50 may be a single-layer or a multi-layer structure, and a material of the UV blocking film layer 50 may include an optical resin material with a UV blocking function, such as TAC, COP, PC, PMMA, or PSA. A total thickness of the UV blocking film layer 50 ranges from 50 to 250 um. On one hand, the UV rays can be blocked using this technology, preventing the light-emitting layer from being damaged by the UV rays in a non-polarizer technology, and on the other hand, a position of a neutral layer of the display module can be adjusted to improve the property of large-curvature bending of the flexible display module, thereby protecting the display device.

It may be understood that, in the present disclosure, the UV blocking film layer 50 is disposed on the color film layer, and the UV blocking film layer 50 is made of the optical resin material, so that the transmittance of the UV rays below 400 nm through the UV blocking film layer 50 is less than 1%, and the transmittance of the visible light is greater than 92%. Furthermore, the display module can reduce the damage to a light-emitting material, an electron hole transport layer, an injection layer, etc. in the display panel PL due to incident UV rays when the external sunlight is irradiated on the display panel PL without using a polarizer, thereby improving the light-emitting chromaticity of the light-emitting layer of electro-excited light, and effectively prolonging the service life of the light-emitting layer.

In an embodiment, a material of the UV blocking film layer 50 includes TAC, COP, PC or PMMA.

Specifically, the material of the UV blocking film layer 50 is mainly an optical resin material. The above materials of TAC, COP, PC, or PMMA all have a function of blocking some UV rays. In addition, the above materials have a proper elastic modulus in a thickness range of 50 to 250 um, and can adapt to the bending of the flexible display module. A UV absorber may further be added to the above materials so that the transmittance of the UV rays (wavelength band below 400 nm) of the material of the UV blocking film layer 50 is below 1%.

Specifically, the UV absorber may include benzotriazole-based compounds, ortho-hydroxybenzophenone-based compounds, salicylate-based compounds, triazine-based compounds, or substituted acrylonitrile-based compounds.

It may be understood that, the reason for adopting the above optical resin material is that the optical resin material has a good elastic modulus and has a certain UV blocking capability. For example, PMMA can effectively filter UV rays with a wavelength of less than 300 nm, but the filtering effect between 300 nm and 400 nm is relatively poor. By adding a UV absorber that can block UV rays in the 300 nm to 400 nm band, the PMMA can effectively block UV rays below 400 nm.

In addition, due to a small amount of UV absorber added, the impact on the transmittance of the visible light is smaller than that of conventional optical resin materials, and the transmittance of the visible light is higher.

In an embodiment, as shown in FIG. 2, the UV blocking film layer 50 includes at least one UV blocking unit layer 500, the UV blocking unit layer 500 includes a UV blocking substrate layer 501 and a UV blocking adhesive layer 502 that are disposed in a stacked manner, and the UV blocking adhesive layer 502 is disposed on a side of the UV blocking substrate layer 501 close to the color film layer.

Specifically, the UV blocking film layer 50 may include an UV blocking unit layer 500, may include two UV blocking unit layers 500, or may include three UV blocking unit layers 500, and the specific quantity of layers is not limited.

Specifically, a total thickness of the UV blocking film layer 50 ranges from 50 to 250 um, and the elastic modulus ranges from 1 to 9 GPa, which meets the requirements of the present disclosure. When there are more than two UV blocking unit layers 500, the UV blocking unit layers 500 are disposed in a stacked manner.

Specifically, the UV blocking unit layer 500 includes a UV blocking substrate layer 501 and a UV blocking adhesive layer 502 that are disposed in a stacked manner, a material of the UV blocking adhesive layer 501 includes TAC, COP, PC, PMMA, etc., and a material of the UV blocking adhesive layer 502 includes acrylic PSA or acrylic PSA.

Specifically, the UV blocking substrate layer 501 may be provided with UV blocking particles. The UV blocking particles include titanium dioxide ($TiO_2$), zinc oxide (ZnO), iron oxide ($Fe_2O_3$), zirconium oxide ($ZrO_2$), silicon dioxide ($SiO_2$), manganese oxide (MnO), aluminum oxide ($Al_2O_3$), cerium oxide ($CeO_2$), mica, silica, talc, and kaolin. The UV blocking particle has an average particle size of 10 to 3000 nm, which may specifically be 10 to 2000 nm, and may specifically be 20 to 500 nm.

It may be understood that, the UV blocking film layer 50 is configured to include at least one UV blocking unit layer 500, and the UV blocking unit layer 500 includes the UV blocking substrate layer 501 and the UV blocking adhesive layer 502, which can effectively improve the capability of a single film layer, and effectively block the UV rays below a 400 nm band. The UV blocking substrate uses TAC, COP and other optical resin materials, which can reach a transmittance of more than 92%, and does not change a polarization state of light.

The UV blocking adhesive layer 502 is disposed in the UV blocking film layer 50, so that the product does not need a step such as coating, and can be directly adhered to the display panel PL when the display module is assembled, improving the production efficiency of the display module. Because the UV blocking adhesive layer 502 as a glue material has a different elastic modulus from the UV blocking substrate layer 501, the UV blocking adhesive layer 502 can provide a certain buffer effect when the flexible display module is bent, to prevent film layers from being split due to excessive bending shear force between the film layers.

In an embodiment, a thickness of the UV blocking film layer 50 ranges from 50 to 250 um, and an elastic modulus of the UV blocking film layer 50 ranges from 1 to 9 GPa.

It should be noted that, a neutral layer is a position at which the layer is not subjected to tensile or compressive stress when the material is bent, and the position of the layer is affected by the overall display module structure and a thickness and an elastic modulus of each layer.

It may be understood that, the thickness of the UV blocking film layer 50 is limited, and a proper range of the elastic modulus is selected, so that the position of the neutral layer can be adjusted by adjusting the thickness of the UV blocking film layer 50, to adjust the neutral layer to the most fragile film layer in the display module, reduce the possibility of splitting of the most fragile film in the display panel PL, and better protect the display module.

In an embodiment, the UV blocking film layer 50 structure includes one UV blocking unit layer 500, the UV blocking substrate layer 501 has a thickness of 20 to 100 um, and the UV blocking adhesive layer 502 has a thickness of 15 to 50 um.

Specifically, a thickness of a UV isolation substrate layer ranges from 20 to 100 um, for example, the thickness may be 20 um, 30 um, 40 um, 45 um, 50 um, 70 um, 100 um, etc.

Specifically, the thickness of the UV blocking adhesive layer 502 ranges from 15 to 50 um, for example, the thickness may be 15 um, 20 um, 25 um, 30 um, 35 um, 40 um, 50 um, etc.

It may be understood that, thicknesses of the UV blocking substrate layer 501 and the UV blocking adhesive layer 502 are limited to proper ranges to prevent the UV isolation substrate layer and/or the UV blocking adhesive layer 502 from being too thick to affect an overall thickness of the module, and prevent the UV isolation substrate layer and/or UV blocking adhesive layer 502 from being too thin to adjust the neutral layer.

In an embodiment, as shown in FIG. 3, the UV blocking film layer 50 includes at least two UV blocking unit layers 500, and e the UV blocking unit layers 500 are disposed in a stacked manner.

Specifically, the two UV blocking unit layers 500 may be directly pasted in a stacked manner, and the UV blocking adhesive layer 502 between the two adjacent UV blocking substrate layers is used for pasting.

Figure 4:
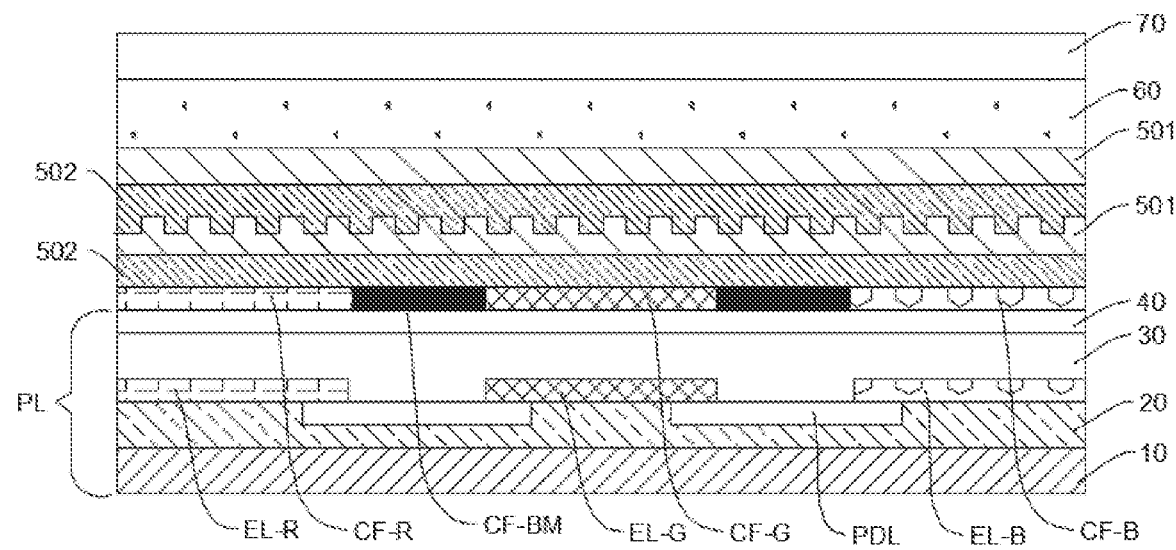
FIG. 4 is a schematic diagram of a structure of another display module with two UV blocking unit layers according to an embodiment of this application.

Specifically, as shown in FIG. 4, a first groove and/or a first protrusion may be disposed on the UV isolation substrate layer adjacent to the UV blocking adhesive layer 502, and the corresponding UV blocking adhesive layer 502 is provided with a second protrusion and/or the first protrusion that match the first groove and/or the first protrusion, to enable each film layer between the UV blocking film layers 50 to adhere more closely, which also has a better buffering effect.

It may be understood that, when the display module is a dynamic folding display module, a multi-layer UV blocking adhesive layer 502 is provided to buffer the shear stress during bending. During the bending, relative shearing movement occurs between the film layers. If there is no UV blocking adhesive layer 502 as a glue film layer for a connection between the film layers, the film layers may split due to the bending shear force. Therefore, a creepable adhesive with low modulus is required for buffering between the film layers when a multi-layer UV blocking unit layer 500 is used.

In an embodiment, the UV blocking film layer 50 includes two UV blocking unit layers 500, the UV blocking substrate layer 501 in the UV blocking unit layer 500 has a thickness of 20 to 40 um, and the UV blocking adhesive layer 502 has a thickness of 15 to 50 um.

It may be understood that, thicknesses of the UV blocking substrate layer 501 and the UV blocking adhesive layer 502 are limited to proper ranges to prevent the UV isolation substrate layer and/or the UV blocking adhesive layer 502 from being too thick to affect an overall thickness of the module, and prevent the UV isolation substrate layer and/or UV blocking adhesive layer 502 from being too thin to adjust the neutral layer.

In an embodiment, an adhesive layer 60 is disposed on a surface of the UV blocking film layer 50 away from the color film layer.

Specifically, as shown in FIG. 1, the adhesive layer is further covered by a cover layer 70.

Specifically, a material of the adhesive layer 60 may be photosensitive adhesive, and a thickness of the adhesive layer 60 ranges from 50 to 150 nm.

It may be understood that, on the basis that the UV blocking film layer 50 is provided with an adhesive layer, the adhesive layer 60 is disposed on a surface of the UV blocking film layer 50 away from the color film layer, which can reduce a pasting process when the display module is assembled and spliced, improve the assembly efficiency of the display module, and reduce pasting steps.

In an embodiment, a material of the UV blocking adhesive layer 502 includes PSA, and a material of the adhesive layer 60 includes photosensitive adhesive.

Specifically, the PSA may be acrylic PSA or acrylic PSA, and the photosensitive adhesive includes epoxy-based photosensitive adhesive, polyester-based photosensitive adhesive, or polyurethane-based photosensitive adhesive.

In an embodiment, in the UV blocking film layer 50, the UV blocking substrate layer 501 and/or the UV blocking adhesive layer 502 are provided with UV blocking particles.

Specifically, the UV blocking particles include titanium dioxide ($TiO_2$), zinc oxide (ZnO), iron oxide ($Fe_2O_3$), zirconium oxide ($ZrO_2$), silicon dioxide ($SiO_2$), manganese oxide (MnO), aluminum oxide ($Al_2O_3$), cerium oxide ($CeO_2$), mica, silica, talc, and kaolin. The UV blocking particle has an average particle size of 10 to 3000 nm, which may specifically be 10 to 2000 nm, and may specifically be 20 to 500 nm.

Moreover, an embodiment of the present disclosure further provides a mobile terminal, including the display module described in any one of the foregoing embodiments and a terminal body. The terminal body and the display module are combined into one body.

In summary, in the present disclosure, the UV blocking film layer 50 is disposed on the color film layer, and the UV blocking film layer 50 is made of the optical resin material, so that the transmittance of the UV rays below 400 nm through the UV blocking film layer 50 is less than 1%, and the transmittance of the visible light is greater than 92%. Furthermore, the display module can reduce the damage to a light-emitting material, an electron hole transport layer, an injection layer, etc. in the display panel PL due to incident UV rays when the external sunlight is irradiated on the display panel PL without using a polarizer, thereby improving the light-emitting chromaticity of the light-emitting layer of electro-excited light, and effectively prolonging the service life of the light-emitting layer. In addition, the optical resin material is used as the main material of the UV blocking film layer 50, so that the display module has better bending performance and can be adapted to the development of the flexible display module. Subsequently, the thickness of the UV blocking film layer 50 is limited, and a proper range of the elastic modulus is selected, so that the position of the neutral layer can be adjusted by adjusting the thickness of the UV blocking film layer 50, to adjust the neutral layer to the most fragile film layer in the display module, reduce the possibility of splitting of the most fragile film in the display panel PL, and better protect the display module.

It may be understood that, for a person of ordinary skill in the art, equivalent replacements or changes can be made according to the technical solutions of the present disclosure and its inventive concept, and all these changes or replacements shall fall within the protection scope of the appended claims of the present disclosure.

What is claimed is:

1. A display module, comprising:
 a display panel; and
 a color film layer disposed on a side of a light-exit surface of the display panel,
 wherein an ultraviolet (UV) blocking film layer is disposed on a side of the color film layer away from the display panel, the UV blocking film layer covers the color film layer, a material of the UV blocking film layer comprises an optical resin material with a UV blocking function, a transmittance of the UV blocking film layer to UV rays below 400 nm is less than 1%, and a transmittance of the UV blocking film layer to visible light is greater than 92%.

2. The display module as claimed in claim 1, wherein a material of the UV blocking film layer comprises triacetyl cellulose (TAC), cyclo olefin polymer (COP), polycarbonate (PC), or polymethyl methacrylate (PMMA).

3. The display module as claimed in claim 2, wherein the UV blocking film layer comprises at least one UV blocking unit layer, the UV blocking unit layer comprises a UV blocking substrate layer and a UV blocking adhesive layer that are disposed in a stacked manner, and the UV blocking adhesive layer is disposed on a side of the UV blocking substrate layer close to the color film layer.

4. The display module as claimed in claim 3, wherein a thickness of the UV blocking film layer ranges from 50 to 250 um, and an elastic modulus of the UV blocking film layer ranges from 1 to 9 GPa.

5. The display module as claimed in claim 4, wherein the UV blocking film layer structure comprises one UV blocking unit layer, the UV blocking substrate layer has a thickness ranging from 20 to 100 um, and the UV blocking adhesive layer has a thickness ranging from 15 to 50 um.

6. The display module as claimed in claim 4, wherein the UV blocking film layer comprises at least two UV blocking unit layers, and the UV blocking unit layers are disposed in a stacked manner.

7. The display module as claimed in claim 6, wherein the UV blocking film layer comprises two UV blocking unit layers, the UV blocking substrate layer in the UV blocking unit layer has a thickness ranging from 20 to 40 um, and the UV blocking adhesive layer has a thickness ranging from 15 to 50 um.

8. The display module as claimed in claim 3, wherein an adhesive layer is disposed on a surface of the UV blocking film layer away from the color film layer.

9. The display module as claimed in claim 8, wherein a material of the UV blocking adhesive layer comprises pressure sensitive adhesive (PSA), and a material of the adhesive layer comprises photosensitive adhesive.

10. The display module as claimed in claim 3, wherein in the UV blocking film layer, the UV blocking substrate layer or the UV blocking adhesive layer are provided with UV blocking particles.

11. A mobile terminal, comprising a display module and a terminal body, wherein the terminal body and the display module are combined into one body, and the display module comprises:
   a display panel; and
   a color film layer disposed on a side of a light-exit surface of the display panel,
   wherein an ultraviolet (UV) blocking film layer is disposed on a side of the color film layer away from the display panel, the UV blocking film layer covers the color film layer, a material of the UV blocking film layer comprises an optical resin material with a UV blocking function, a transmittance of the UV blocking film layer to UV rays below 400 nm is less than 1%, and a transmittance of the UV blocking film layer to visible light is greater than 92%.

12. The mobile terminal as claimed in claim 11, wherein a material of the UV blocking film layer comprises triacetyl cellulose (TAC), cyclo olefin polymer (COP), polycarbonate (PC), or polymethyl methacrylate (PMMA).

13. The mobile terminal as claimed in claim 12, wherein the UV blocking film layer comprises at least one UV blocking unit layer, the UV blocking unit layer comprises a UV blocking substrate layer and a UV blocking adhesive layer that are disposed in a stacked manner, and the UV blocking adhesive layer is disposed on a side of the UV blocking substrate layer close to the color film layer.

14. The mobile terminal as claimed in claim 13, wherein a thickness of the UV blocking film layer ranges from 50 to 250 um, and an elastic modulus of the UV blocking film layer ranges from 1 to 9 GPa.

15. The mobile terminal as claimed in claim 14, wherein the UV blocking film layer structure comprises one UV blocking unit layer, the UV blocking substrate layer has a thickness ranging from 20 to 100 um, and the UV blocking adhesive layer has a thickness ranging from 15 to 50 um.

16. The mobile terminal as claimed in claim 14, wherein the UV blocking film layer comprises at least two UV blocking unit layers, and the UV blocking unit layers are disposed in a stacked manner.

17. The mobile terminal as claimed in claim 16, wherein the UV blocking film layer comprises two UV blocking unit layers, the UV blocking unit layer in the UV blocking substrate layer has a thickness ranging from 20 to 40 um, and the UV blocking adhesive layer has a thickness ranging from 15 to 50 um.

18. The mobile terminal as claimed in claim 13, wherein an adhesive layer is disposed on a surface of the UV blocking film layer away from the color film layer.

19. The mobile terminal as claimed in claim 18, wherein a material of the UV blocking adhesive layer comprises pressure sensitive adhesive (PSA), and a material of the adhesive layer comprises photosensitive adhesive.

20. The mobile terminal as claimed in claim 13, wherein in the UV blocking film layer, the UV blocking substrate layer or the UV blocking adhesive layer are provided with UV blocking particles.

* * * * *